US008933760B2

(12) United States Patent
Cheyne et al.

(10) Patent No.: US 8,933,760 B2
(45) Date of Patent: Jan. 13, 2015

(54) SYSTEM AND METHODS FOR CORRECTING CLOCK SYNCHRONIZATION ERRORS

(71) Applicant: Cornell University, Ithaca, NY (US)

(72) Inventors: Harold Cheyne, Trumansburg, NY (US); Adam Strickhart, Reston, VA (US); Peter Marchetto, Ithaca, NY (US); Raymond Mack, Cortland, NY (US)

(73) Assignee: Cornell University, Ithaca, NY (US)

( * ) Notice: Subject to any disclaimer, the term of this patent is extended or adjusted under 35 U.S.C. 154(b) by 100 days.

(21) Appl. No.: 13/655,281

(22) Filed: Oct. 18, 2012

(65) Prior Publication Data

US 2013/0099869 A1    Apr. 25, 2013

Related U.S. Application Data

(60) Provisional application No. 61/548,886, filed on Oct. 19, 2011.

(51) Int. Cl.
*H03L 1/02*    (2006.01)

(52) U.S. Cl.
CPC ............... *H03L 1/022* (2013.01); *H03L 1/026* (2013.01)
USPC ............................................ 331/176; 331/34

(58) Field of Classification Search
USPC .................................................. 331/176, 34
See application file for complete search history.

(56) References Cited

U.S. PATENT DOCUMENTS

| 7,782,195 | B2 | 8/2010 | Agranat | |
|---|---|---|---|---|
| 2002/0005765 | A1* | 1/2002 | Ashley et al. | 331/176 |
| 2005/0093638 | A1* | 5/2005 | Lin et al. | 331/176 |
| 2008/0164952 | A1* | 7/2008 | Babitch | 331/66 |
| 2008/0297268 | A1* | 12/2008 | Matsui et al. | 331/176 |

OTHER PUBLICATIONS

"Clock Synchronization," Wikipedia, accessed Oct. 13, 2011.
"Data Logger," Wikipedia, accessed Oct. 13, 2011.
Acevedo, et al., "Using automated digital recording systems as effective tools for the monitoring of birds and amphibians." (2006) Wildlife Society Bulletin, vol. 34 (I), pp. 211-214.
Arias, et al., "Acoustic detection of beaked whales from autonomous recording buoys." (2008) Journal of the Acoustical Society of America, vol. 123 (5), p. 3207.
Brandes, "Automated sound recording and analysis techniques for bird surveys and conservation." (2008) Bird Conservation International, vol. 18, pp. 163-173.
Calupca, et al., "A compact digital recording system for autonomous bioacoustic monitoring." (2000) Journal of the Acoustical Society of America, vol. 108 (5), p. 2582.
Fristrup, et al., "Acoustic Monitoring of Threatened and Endangered Species in Inaccessible Areas." (2009)SERDP Project SI-1185, http://dtic.mil/.

(Continued)

*Primary Examiner* — Joseph Chang
(74) *Attorney, Agent, or Firm* — Valauskas Corder LLC

(57) ABSTRACT

Clock synchronization error is corrected or minimized by fitting a parabolic f(T) function to the crystal's data, and compensating for sampling period drift in an Analog to Digital Converter (ADC) at various temperatures.

1 Claim, 3 Drawing Sheets

(56) References Cited

OTHER PUBLICATIONS

Lymberopoulos, et al., "XYZ: A motion-enabled, power aware sensor node platform for distributed sensor network applications." (2005) Proceedings of the 4th International Symposium on Information Processing in Sensor Networks, pp. 4934-5000.

Rosenberg, et al., "Final Report for Fall 2005 & Spring 2006, Legacy Program: Migratory Bird Monitoring Using Automated Acoustic and Internet Technologies." (2007) [online] URL,:http:I/www.dodpif. or~/legacy/05-245-Acoustic-Inteieacto ustic-report.pdf.

* cited by examiner

| Average Absolute Synchronization | | | | |
|---|---|---|---|---|
| | Uncompensated | | Compensated | |
| Chan. | Mean (s) | Std Dev (s) | Mean (s) | Std Dev (s) |
| 1 | 0.615 | 0.453 | 0.426 | 0.262 |
| 2 | 0.619 | 0.429 | 0.508 | 0.226 |
| 3 | 0.688 | 0.447 | 0.396 | 0.223 |

| Average Relative Synchronization | | | | |
|---|---|---|---|---|
| | Uncompensated | | Compensated | |
| Chan. | Mean (s) | Std Dev (s) | Mean (s) | Std Dev (s) |
| 1 to 2 | 0.331 | 0.207 | 0.136 | 0.145 |
| 1 to 3 | 0.970 | 0.944 | 0.316 | 0.229 |

SYSTEM AND METHODS FOR CORRECTING CLOCK SYNCHRONIZATION ERRORS

CROSS-REFERENCE TO RELATED APPLICATIONS

This application claims priority to U.S. Provisional Application No. 61/548,886, filed Oct. 19, 2011, which is incorporated by reference herein in its entirety.

FIELD OF THE INVENTION

The present invention relates generally to oscillators, and, more specifically, to a system and methods for compensating timing uncertainty resulting from thermally induced drift in quartz crystals.

BACKGROUND OF THE INVENTION

There are a number of devices that use oscillators, and, in particular, crystal oscillators. A crystal oscillator is a circuit that uses the resonance of a vibrating crystal of piezoelectric material to create an electrical signal with a very precise frequency. A very precise frequency provides a stable clock signal in digital integrated circuits used in applications such as to keep track of time, to provide a stable clock signal for digital integrated circuits, and to stabilize frequencies for radio transmitters and receivers. The most common type of piezoelectric resonator used is the quartz crystal. Crystal oscillators are used in devices such as dataloggers, wristwatches, clocks, radios, computers, signal generators, and oscilloscopes.

A tuning-fork quartz crystal oscillator is one of a family of devices that vibrate at a given frequency when invested with energy by way of an electric field. However, internal mechanical stresses coupled with thermal expansion of the device and contraction cause this frequency to vary with temperature. The variation can be roughly characterized by a parabolic function, f(T), such that $f(T)=k_1 T^2+k_2 T+k_3$. Each crystal is designed with a stability temperature, $T_0$, and corresponding frequency $f_0$, near which small changes in temperature result in small changes in frequency. Most commercially available crystals have a $T_0$ around room temperature (20±2° C.). Operation at temperatures far from $T_0$ results in increasing deviations from $f_0$. When such a crystal is used to generate the sampling clock for an Analog to Digital Converter (ADC) at temperatures far from $T_0$, the sampling rate is inaccurate by the same factor.

Existing methods used to minimize the temperature dependence of the oscillator include (a) heating it to $T_0$, known as furnacing the crystal; (b) cutting the crystal such that its $T_0$ is at the target temperature for operation; or (c) cutting the crystal to create a flatter f(T) function—that is, minimizing $k_1$ and $k_2$. Disadvantages of these methods are that furnacing is power intensive, while custom crystal cutting for flat f(T) or target $T_0$ is cost prohibitive for most applications, and does not compensate for additional temperature variations.

As an example, a data acquisition platform used by the Marine Autonomous Recording Unit (MARU) typically operates near 0° C. for months at a time, resulting in the accumulation of several minutes of sampling period drift. Additionally its power and cost budgets are limited, making furnaced or custom-cut crystals infeasible. As another example, clock synchronization error among multiple data recorders, each with its own quartz crystal oscillator (QCO), can be influenced by temperature variations and these errors accumulate over long duration recordings. This is due to each QCO having its own unique temperature dependence function.

What is needed is a system and methods to minimize the frequency error or clock synchronization error of oscillators. The present invention satisfies this demand.

SUMMARY OF THE INVENTION

The present invention is a method for minimizing the frequency error or clock synchronization error of oscillators. One embodiment of the present invention reduces sampling period drift as it pertains to acoustically-derived location estimates.

The system and methods of the present invention are advantageous over conventional prior art systems and methods in that the crystals used need not be specifically manufactured to have a flat generalized fit f(T) function or a targeted temperature $T_0$. The present invention may be applied during or after the analog to digital conversion (ADC) part of an autonomous acoustic recording system where the power provided to the system is insufficient for furnacing a crystal.

The present invention implements temperature correction of frequency for a crystal oscillator by characterizing a parabolic function for the crystal oscillator. This may be done by measuring the oscillation rate over a range of temperatures. Temperature of the crystal oscillator is recorded during a time period requiring temperature correction to obtain a temperature log of data. A frequency-drift profile is generated and applied to the temperature log to minimize frequency error of the data of the crystal oscillator. The frequency-drift profile may be generated by combining the temperature log and the parabolic function into the frequency-drift profile such that the sample periods of digital data in the temperature log is adjusted in proportion to the frequency-drift profile.

The present invention and its attributes and advantages may be further understood and appreciated with reference to the detailed description below of one contemplated embodiment, taken in conjunction with the accompanying drawing.

DESCRIPTION OF THE DRAWING

The preferred embodiments of the invention will be described in conjunction with the appended drawings provided to illustrate and not to limit the invention, where like designations denote like elements, and in which.

DETAILED DESCRIPTION OF THE INVENTION

The present invention compensates the timing uncertainty resulting from thermally induced drift in quartz crystals. The present invention is robust enough to be used for low $f_s$ applications, such as for acoustic recordings and localization, and is an attractive alternative when power or cost constraints preclude the use of furnaced or cut crystals.

In one embodiment, the clock crystals used were part of ADC boards. The crystals were used along with a low-power oscillator with a temperature stability of 0.1 ppm/° C. Power was applied to the ADC boards on a mounting fixture. The temperature of each crystal was taken by a thermocouple input to a thermometer board. The 40 kHz clock output of the ADC boards was input to a frequency counter through a signal relay board. A personal computer running data-logging software was used to log data from the f(T) curve, and was also used to control the system using the relay board.

The ADCs were attached to the mounting fixture, and the program started. The first few readings were taken at room temperature (~20° C.), then the fixture was lowered into a freezer and remained there until its temperature stabilized around −10±2° C. At this point, it was removed and allowed to return to room temperature, in order to characterize system hysteresis.

Figure 1:
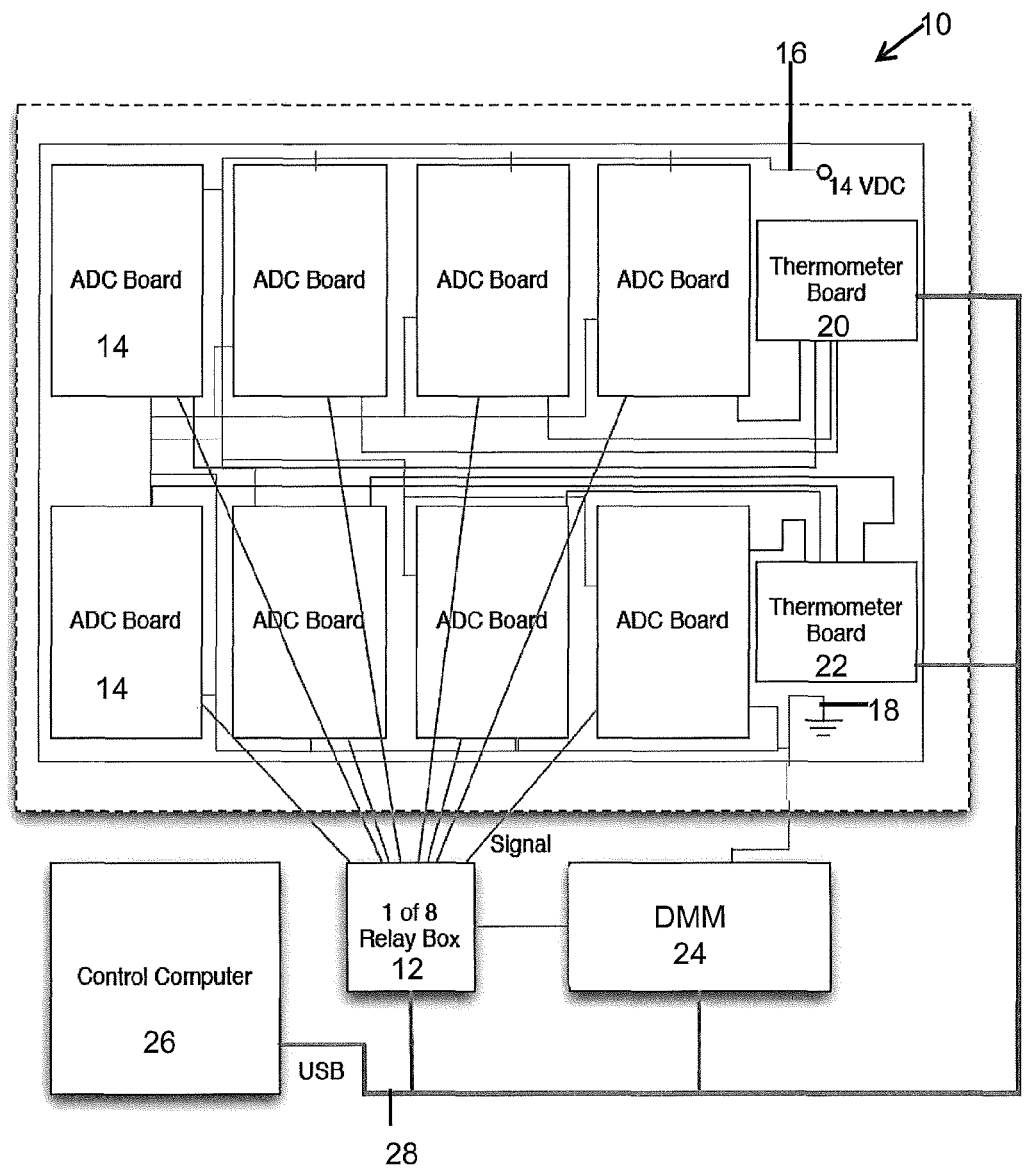
FIG. 1 is a block diagram illustrating one embodiment of a system for correcting clock synchronization errors according to the present invention.

More specifically, FIG. 1 shows one embodiment of a system 10 of the present invention. The system 10 includes a relay box 12 connected to a plurality of ADC boards 14 and provides signals to the ADC boards 14. In this embodiment eight ADC boards are provided and have four ADC boards connected to a "high voltage" power source 16 of 14VDC and four ADC boards connected to a "low voltage" ground 18. The four ADC boards connected to the high voltage power source 16 are also connected in parallel to a thermometer board 20. Similarly, the four ADC boards connected to the ground 18 are also connected in parallel to a thermometer board 22.

The system 10 also includes a digital multimeter 24 and a control computer 26. The digital multimeter 24 connects to the relay box 12. Additionally, the digital multimeter (DMM) 24 functions as the frequency counter and connects to each of the ADC boards 14 and the ground 18. The control computer 26 connects via a universal serial bus (USB) 28 to the relay box 12, the digital multimeter 24, the thermometer board 20, and the other thermometer board 22.

Figure 2:
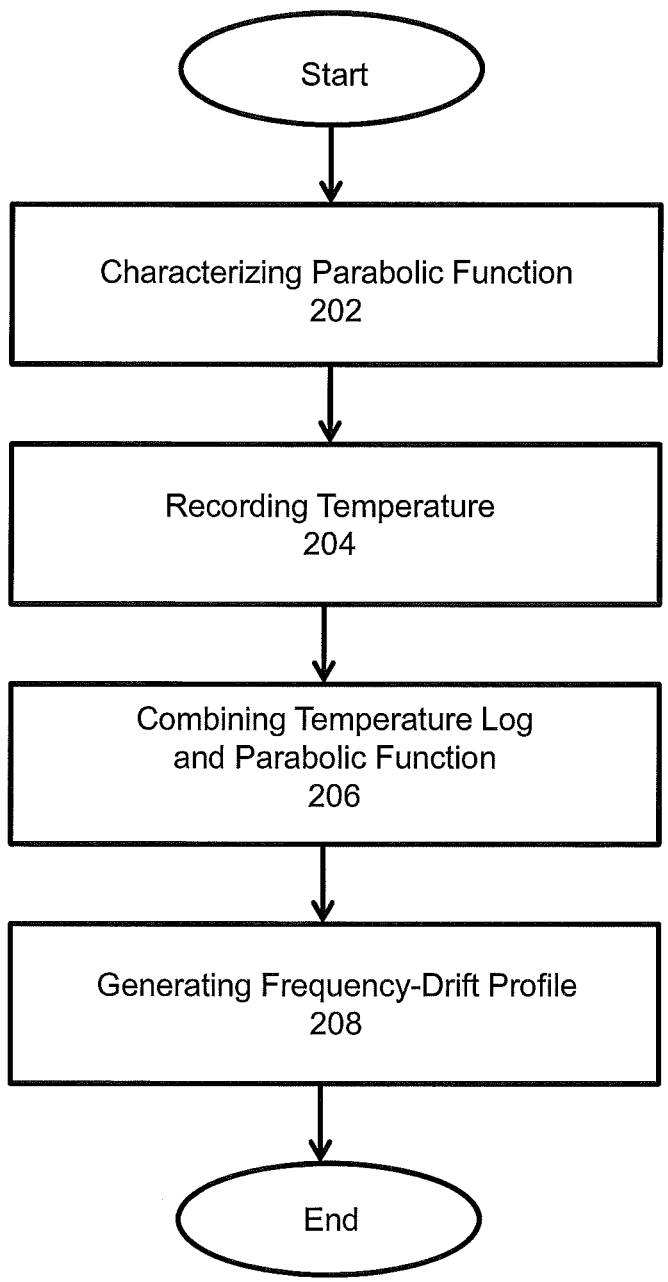
FIG. 2 is a flow chart illustrating one embodiment of a method for correcting clock synchronization errors according to the present invention.

FIG. 2 is a flow chart 200 illustrating one embodiment of a method for correcting clock synchronization errors according to the present invention. Knowing that the system and methods of the present invention follows a parabolic temperature response, implementing temperature correction of frequency takes place in four phases. The first phase is the characterization the f(T) function for the crystal oscillator as shown by step 202. The second is datalogging the temperature of the oscillator during the period requiring correction as shown by step 204. The third is the combination of the temperature log and the f(T) function into a frequency-drift profile for that period as shown by step 206. The final stage shown in step 208 is the application of the frequency-drift profile to the data recorded in that period.

The first phase requires measurement of the crystal's oscillation rate over a range of temperatures. This range must include any temperature to which the crystal might be exposed during its use.

The second phase of the process requires measurement and recording of the crystal's temperature over the course of the correction period. The measurement interval should be based on the expected rate of temperature change of the crystal and on any implementation specifics of the temperature datalogger, including the temperature datalogger's own temperature and timing uncertainties. The second phase was executed as follows.

The characterized ADC board was then used in an underwater recorder. A digital temperature logger, sampling temperature at 15-minute intervals, was installed next to the ADC. The electronics surrounding the crystal are low enough power that self-heating was not significant. The 15-minute interval was at least twice as long as the expected accumulated frequency-drift of the clock crystal over the recorder's total use, ensuring that the correction factor applied to the recording would never deviate by more than one interval. The temperature datalogger continued to sample the temperature in the recorder throughout the entire recording period.

The third phase generates a frequency-drift profile over the correction period. Giving the temperature time series as input to the f(T) function gives the modeled frequencies vs. time. These can be compared to $f_0$ to calculate the error in each interval and over the whole correction period. Depending on the nature of the data recorded during this period, an alternate method of expressing the effect of drift may be appropriate. The third phase was implemented by recording the temperature extracted from the datalogger and saving it in a generic Comma-Separated-Value format (.CSV). The temperature data were then used to generate a temperature-correction profile over time for the recording, using the sampling rate of the audio recording to properly scale the frequency drift of the crystal. The corrective sample counts were calculated according to the following equation:

$$N = t_i \frac{f_s - f_s f(T_i)}{f_c} + C$$

$$= t_i \frac{f_s - f_s(k_1 T_i^2 + k_2 T_i + k_3)}{f_c} + C$$

Where N is the sample count, $t_i$ was the interval duration in seconds, $f_s$ was the desired sampling rate of the audio recording in Hz, $T_i$ was the measured temperature for the interval in degrees Celsius, $f_c$ was the theoretical frequency of the crystal at $T_0$ in Hz, C was an accumulated correction factor in samples which is discussed below, and $k_1$, $k_2$, and $k_3$ were the quadratic coefficients of the frequency drift model in Hz/° $C^2$, Hz/° C., and Hz, respectively. In general N was not an integer value, so to correct for this N was rounded to the nearest integer, and a running tally of the error that this introduced was kept. Whenever the absolute value of the tally exceeded one, that sample was removed from the tally and added to or subtracted from the current interval's sample count. This correction factor kept the sub-sample error over the entire temperature profile less than one. Both the rounding and the sample accumulation were accounted for in the C term of the equation above.

The fourth and final phase corrects the recorded data using the error information, involving increasing or decreasing the amount of data in each temperature-log interval proportionally to its frequency error. There are several methods for changing the number of samples in each interval, from simple duplication or deletion of select samples to filter based operations that minimally affect frequency content. The temperature-correction profile's format was designed to compare the actual and desired positions of two samples, calculating the difference between their actual interval and desired interval, and then evenly duplicating or omitting samples throughout the interval. This process was applied to the data in 15-minute intervals, using the calculated sample count for each temperature-log interval To evaluate this procedure in the absence of an absolute time reference, three underwater recorders were assembled and prepared as in the first two phases above. Their recordings were started and the units were placed in a large chest freezer at 2° C.±0.5° C. They were left for 18 days. Periodically, the freezer was opened, and a sound was made to provide a distinct, simultaneous event on each recording. After 18 days, the recordings were terminated. Phases three and four of the above procedure were applied to the recordings, and the results analyzed.

Figures 3, 4, 5:
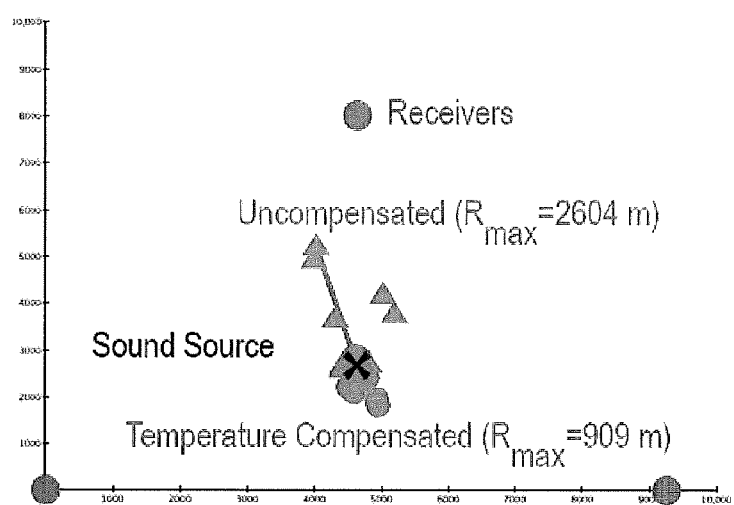
FIG. 3 is a table illustrating the average absolute error per channel for all test sounds.
FIG. 4 is a table illustrating the average relative error between channels for all test sounds.
FIG. 5 is a graph illustrating the example sound localization by compensated and uncompensated data.

Two synchronization metrics were measured. First, the absolute error between the recorded time of arrival and the expected time of arrival was calculated to evaluate the change in accuracy of the synchronization. Second, the relative error in time of arrival between units was calculated to evaluate the change in precision of the synchronization. In FIG. 3, the average absolute error of each unit is given. In FIG. 4, the average relative error between units is given. This improvement is equivalent to using a Temperature-Compensated Crystal Oscillator (TCXO) on the ADC board.

FIG. 5 is a graph illustrating the example sound localization by compensated and uncompensated data. In FIG. 5, the relative synchronization data were applied to a theoretical, typical, arrayed deployment in which the produced sounds would reach each unit at the same time. A localization algorithm was run on the data to evaluate the practical effect of the synchronization improvement. According to FIG. 5, X is the sound source, O marks the acoustic receivers, triangles designate location estimates from uncompensated data, and dots designate location estimates from temperature compensated data. It should be noted that the uncompensated data have a higher maximum error and variance than the temperature compensated data. As can be seen, the temperature compensation algorithm improves the accuracy of the localization by a factor greater than two. The uncompensated locations are incorrect by 981 meters on average, with a standard deviation of 931 meters. The compensated locations are incorrect by 368 meters on average, with a standard deviation of 301 meters.

While the present invention and what is considered presently to be the best modes thereof have been described in a manner that establishes possession thereof by the inventors and that enables those of ordinary skill in the art to make and use the inventions, it will be understood and appreciated that there are many equivalents to the exemplary embodiments disclosed herein and that myriad modifications and variations may be made thereto without departing from the scope and spirit of the invention, which is to be limited not by the exemplary embodiments but by the appended claims.

The invention claimed is:

1. A method for correcting clock synchronization error of a crystal oscillator by implementing temperature correction of frequency comprising the steps of:

characterizing a parabolic function for the crystal oscillator by measuring an oscillation rate over a range of temperatures;

recording temperature data and frequency data of the crystal oscillator during a time period requiring temperature correction to obtain at least one interval consisting of a number of samples, each sample including recorded temperature data and recorded frequency data;

generating a frequency-drift profile by inputting the recorded temperature data of each sample into the parabolic function to calculate frequency error in each of the intervals;

applying the frequency-drift profile to each of the intervals, the applying step further comprising the step of adjusting the number of samples of each interval, the number of samples adjusted in proportion to the frequency-drift profile by duplicating or deleting one or more samples in each interval to obtain revised intervals with an adjusted number of samples; and using the revised intervals with an adjusted number of samples to minimize frequency error of the data of the crystal oscillator.

* * * * *